US008809166B2

(12) United States Patent
Buenning et al.

(10) Patent No.: US 8,809,166 B2
(45) Date of Patent: Aug. 19, 2014

(54) HIGH DIE STRENGTH SEMICONDUCTOR WAFER PROCESSING METHOD AND SYSTEM

(71) Applicant: NXP B.V., Eindhoven (NL)

(72) Inventors: Hartmut Buenning, Hamburg (DE); Sascha Moeller, Hamburg (DE); Martin Lapke, Hamburg (DE); Guido Albermann, Hamburg (DE); Thomas Rohleder, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/721,674

(22) Filed: Dec. 20, 2012

(65) Prior Publication Data

US 2014/0179083 A1     Jun. 26, 2014

(51) Int. Cl.
*H01L 21/00*     (2006.01)
*H01L 21/78*     (2006.01)

(52) U.S. Cl.
CPC .................................... *H01L 21/78* (2013.01)
USPC ........... 438/463; 438/460; 438/462; 438/464; 438/113

(58) Field of Classification Search
CPC ...................................................... H01L 21/78
USPC ..................... 438/29, 33, 113, 458, 460–465; 257/E21.599
See application file for complete search history.

(56) References Cited

U.S. PATENT DOCUMENTS

| | | | |
|---|---|---|---|
| 6,734,083 B2 * | 5/2004 | Kobayashi .................... 438/462 |
| 6,737,606 B2 | 5/2004 | Wai et al. | |
| 7,008,861 B2 * | 3/2006 | Andrews et al. ............. 438/463 |
| 7,041,578 B2 | 5/2006 | Mahle et al. | |
| 7,179,723 B2 * | 2/2007 | Genda et al. .................. 438/462 |
| 7,211,526 B2 * | 5/2007 | Iri et al. ........................ 438/797 |
| 7,265,034 B2 * | 9/2007 | Lu et al. ........................ 438/463 |
| 7,550,367 B2 * | 6/2009 | Tamura et al. ................ 438/463 |
| 7,696,012 B2 * | 4/2010 | Nakamura .................... 438/114 |
| 7,825,771 B2 * | 11/2010 | Bhogal et al. ................ 340/10.1 |
| 8,129,258 B2 * | 3/2012 | Hosier et al. .................. 438/460 |
| 8,268,704 B2 * | 9/2012 | Fujii et al. .................... 438/460 |
| 2002/0031899 A1 * | 3/2002 | Manor ......................... 438/460 |
| 2002/0115235 A1 * | 8/2002 | Sawada ........................ 438/113 |
| 2004/0224483 A1 * | 11/2004 | Takyu et al. .................. 438/462 |
| 2004/0241962 A1 * | 12/2004 | Nagai ........................... 438/460 |
| 2005/0130390 A1 * | 6/2005 | Andrews et al. ............. 438/458 |
| 2005/0170616 A1 * | 8/2005 | Murata et al. ................ 438/463 |
| 2005/0202650 A1 | 9/2005 | Imori et al. | |
| 2005/0272223 A1 * | 12/2005 | Fujii et al. .................... 438/459 |

(Continued)

OTHER PUBLICATIONS

Li J. et al.; "Laser Dicing and Subsequent Die Strenght Enhancement Technologies for Ultra-thin Wafer"; Electronic Components and Technology Conference; IEEE; 2007; p. 1-6.

(Continued)

*Primary Examiner* — Mary Wilczewski
*Assistant Examiner* — Erik T Peterson (57) ABSTRACT

Embodiments of methods and systems for processing a semiconductor wafer are described. In one embodiment, a method for processing a semiconductor wafer involves performing laser stealth dicing on the semiconductor wafer to form a stealth dicing layer within the semiconductor wafer and after performing laser stealth dicing, cleaning the semiconductor wafer from a back-side surface of the semiconductor wafer with a blade to remove at least a portion of the stealth dicing layer. Other embodiments are also described.

9 Claims, 9 Drawing Sheets

(56) References Cited

U.S. PATENT DOCUMENTS

| | | | |
|---|---|---|---|
| 2006/0040472 A1* | 2/2006 | Tamura et al. | 438/460 |
| 2006/0148211 A1* | 7/2006 | Iwasaki et al. | 438/462 |
| 2006/0189099 A1* | 8/2006 | Lu et al. | 438/460 |
| 2007/0105345 A1* | 5/2007 | Kurosawa | 438/460 |
| 2007/0207594 A1* | 9/2007 | Tamura | 438/463 |
| 2008/0096368 A1* | 4/2008 | Sakai | 438/473 |
| 2008/0299745 A1* | 12/2008 | Morikazu | 438/463 |
| 2009/0096614 A1* | 4/2009 | Singleton et al. | 340/572.8 |
| 2009/0121337 A1* | 5/2009 | Abe et al. | 257/686 |
| 2009/0215245 A1* | 8/2009 | Nakamura | 438/463 |
| 2010/0047999 A1* | 2/2010 | Hoshino et al. | 438/463 |
| 2010/0181650 A1 | 7/2010 | Shigihara et al. | |
| 2011/0124180 A1* | 5/2011 | Abe et al. | 438/462 |
| 2011/0147466 A1* | 6/2011 | Kang et al. | 235/492 |
| 2011/0147898 A1* | 6/2011 | Hosier et al. | 257/620 |
| 2011/0233705 A1 | 9/2011 | Lake | |
| 2011/0287608 A1* | 11/2011 | Saegusa et al. | 438/462 |
| 2011/0298084 A1* | 12/2011 | Tamemoto | 257/507 |
| 2012/0077296 A1* | 3/2012 | Yamada et al. | 438/33 |
| 2012/0083059 A1* | 4/2012 | Hoshino et al. | 438/33 |
| 2012/0108035 A1* | 5/2012 | Kim et al. | 438/463 |
| 2012/0135585 A1* | 5/2012 | Shimoi et al. | 438/463 |
| 2012/0156816 A1* | 6/2012 | Okamura et al. | 438/33 |

OTHER PUBLICATIONS

Hamamatsu; "Stealth Dicing Technology and Applications"; Technical Information; TLAS9004E01; Mar. 2005; p. 1-8.

* cited by examiner

HIGH DIE STRENGTH SEMICONDUCTOR WAFER PROCESSING METHOD AND SYSTEM

After wafer fabrication, a semiconductor wafer is separated into individual integrated circuit (IC) dies or chips in a process known as pre-assembly. The separation of a semiconductor wafer is critical to the strength of the individual IC dies, which can ultimately affect the quality of chips. For example, high die strength is a major criterion for banking and passport card products due to high warpage when the cards are used or carried around. For radio frequency identification (RFID) tags, higher die strength reduces the occurrence of die cracking during a subsequent assembly process. When the die strength is increased, the strength of packaged/bared chips can be increased and field returns of the final circuit products can be reduced.

Traditionally, blade dicing or laser dicing is used for the separation of a semiconductor wafer into individual dies. However, traditional blade dicing techniques and laser dicing techniques can cause cracks in die edges during the assembly process, which reduces individual die strength. In addition, traditional blade dicing techniques typically require a relatively large sawlane width, which negatively affects the amount of potential good dies per wafer (PGDW). Therefore, there is a need for a wafer processing technique that can separate a wafer into IC dies with high die strength and that can achieve a relatively small sawlane width.

Embodiments of methods and systems for processing a semiconductor wafer are described. In one embodiment, a method for processing a semiconductor wafer involves performing laser stealth dicing on the semiconductor wafer to form a stealth dicing layer within the semiconductor wafer and after performing laser stealth dicing, cleaning the semiconductor wafer from a back-side surface of the semiconductor wafer with a blade to remove at least a portion of the stealth dicing layer. By using the combination of stealth laser dicing and blade cleaning, the sidewall strength of separated IC dies is improved and a relatively small sawlane width is achieved. The wafer processing method can be applied to RFID tags that require high die strength during assembly and usage and financial and identification cards that must withstand high mechanical stress from bending. Other embodiments are also described.

In an embodiment, a method for processing a semiconductor wafer includes performing laser stealth dicing on the semiconductor wafer to form a stealth dicing layer within the semiconductor wafer and after performing laser stealth dicing, cleaning the semiconductor wafer from a back-side surface of the semiconductor wafer with a blade to remove at least a portion of the stealth dicing layer.

In an embodiment, a system for processing a semiconductor wafer includes a laser stealth dicing system configured to perform laser stealth dicing on a semiconductor wafer to form a stealth dicing layer within the semiconductor wafer and a blade cleaning system configured to clean the semiconductor wafer from a back-side surface of the semiconductor wafer with a blade to remove at least a portion of the stealth dicing layer.

In an embodiment, a method for processing a semiconductor wafer includes performing laser stealth dicing on a semiconductor wafer to form a stealth dicing layer within the semiconductor wafer and after performing laser stealth dicing, cleaning the semiconductor wafer from a back-side surface of the semiconductor wafer with a blade to remove at least a portion of the stealth dicing layer. Performing laser stealth dicing includes applying a laser beam through a silicon substrate of the semiconductor wafer at a focus point that is within the silicon substrate to change a monocrystalline silicon structure around the focus point into a polycrystalline silicon structure and to propagate a crack in the semiconductor wafer. Cleaning the semiconductor wafer includes cutting through the back-side surface of the semiconductor wafer at the stealth dicing layer using the blade without cutting entirely through the semiconductor wafer.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
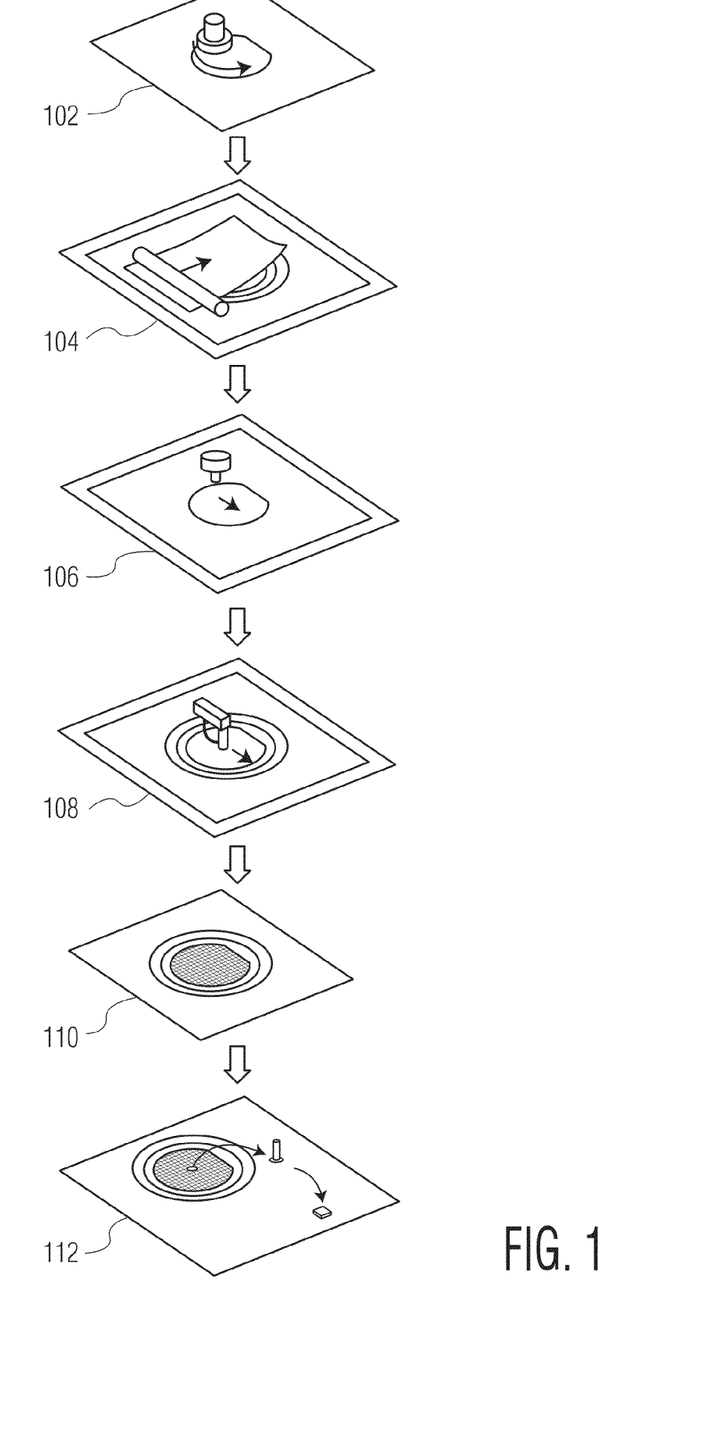
FIG. 1 is a process flow diagram that illustrates a method for processing a semiconductor wafer in accordance with an embodiment of the invention.

FIG. 1 is a process flow diagram that illustrates a method for processing a semiconductor wafer in accordance with an embodiment of the invention. In the embodiment depicted in FIG. 1, the illustrated wafer processing method includes a wafer thinning step 102, a tape mount step 104, a stealth laser dicing step 106, a blade cleaning step 108, a tape expand/remount step 110, and a die bonding step 112. Although the wafer processing method is show in FIG. 1 as including six steps, in some other embodiments, the wafer processing method may include more than six steps or less than six steps.

The wafer processing method illustrated in FIG. 1 uses a combination of stealth laser dicing and blade cleaning to improve the sidewall strength of individual IC dies and to achieve a relatively small sawlane width. For example, the method involves utilizing stealth laser dicing combined with a back-side blade cleaning process to remove material in a stealth dicing layer that is created in the stealth dicing process. The wafer processing method is especially applicable to RFID tags that require high die strength during assembly and usage as well as smart cards that must withstand high mechanical stress from bending.

In the wafer thinning step 102, the thickness of the semiconductor wafer is reduced to a predefined value. A variety of wafer thinning techniques can be used to reduce the wafer thickness by removing one or more semiconductor substrate layers from, for example, the back-side. Examples of wafer thinning techniques include, but are not limited to, mechanical grinding, chemical mechanical polishing (CMP), wet etching, and dry etching. In an embodiment, the wafer is thinned by mechanical back grinding. In an embodiment, the semiconductor wafer is thinned to a predefined thickness before laser stealth dicing is performed.

In the tape mount step 104, a dicing tape is applied to the thinned wafer to prepare the wafer for the stealth laser dicing step. In an embodiment, the dicing tape is applied onto a front-side surface of the semiconductor wafer on which a circuitry layer is formed. Although the tape mount step 104 is shown in FIG. 1 as taking place after the wafer thinning step 102, in other embodiments, a dicing tape is applied to the semiconductor wafer before the wafer thinning step 102. In these embodiments, the wafer can be thinned by back grinding.

In the stealth laser dicing step 106, stealth dicing technology is used to apply at least one laser beam through substrate material of the semiconductor wafer at a focus point that is within the semiconductor wafer to change the substrate material around the focus point and propagate a crack in the semiconductor wafer. Because of the energy of the laser beam, the original substrate material around the focus point is modified into a new substrate material that is different from the original substrate material in density. For a silicon wafer, a laser beam is applied through the silicon substrate of the semiconductor wafer at a focus point that is within the silicon substrate to change a monocrystalline silicon structure of the substrate around the focus point into a polycrystalline silicon structure and to propagate a crack in the wafer. Compared to traditional wafer dicing technology, stealth dicing technology has numerous advantages. For example, stealth dicing technology can be used for high speed wafer dicing. In addition, stealth dicing technology can lead to high quality ultra-thin chips with superior breakage strength and low wafer material loss. Furthermore, stealth dicing technology is a dry process with low running costs. The stealth laser dicing step 106 can be implemented using stealth dicing technology as described in the technical report from Hamamatsu Photonics, titled "Stealth Dicing Technology and Application," of March 2005, which is incorporated herein for reference as a whole.

Figure 2:
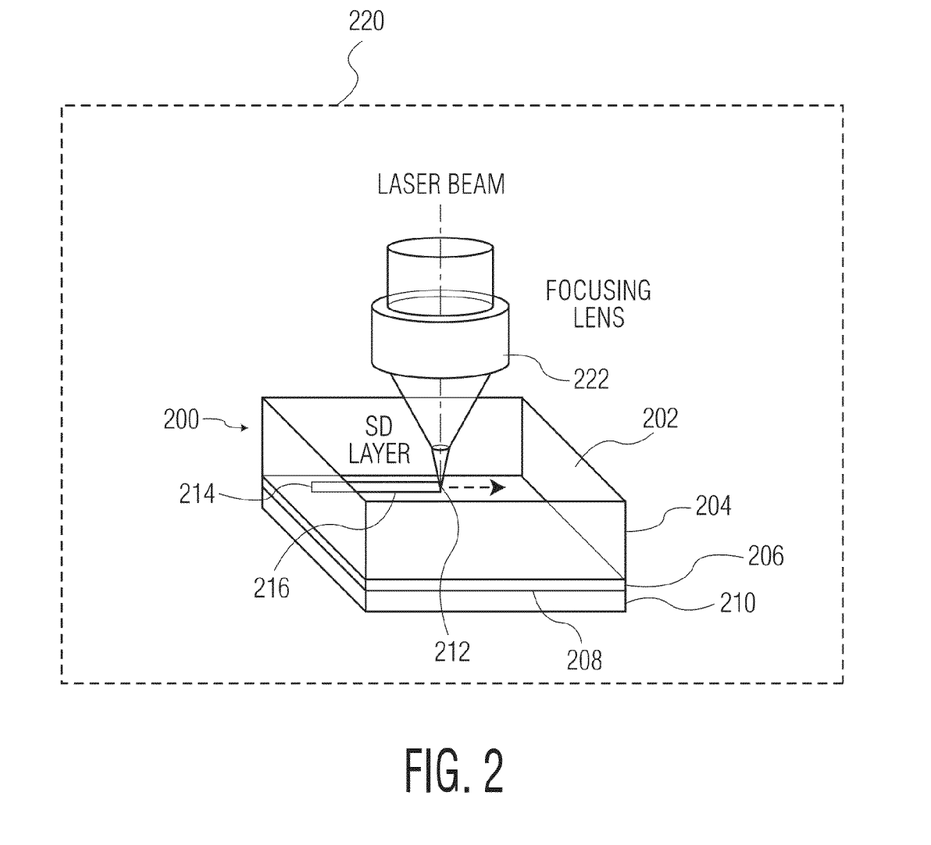
FIG. 2 depicts a stealth laser dicing system in accordance with an embodiment of the invention.

FIG. 2 depicts a stealth laser dicing system 220 that can be used to perform the stealth laser dicing step 106 on a semiconductor wafer 200 in accordance with an embodiment of the invention. The stealth laser dicing system performs laser stealth dicing on the semiconductor wafer from a back-side surface 202 of the semiconductor wafer to form a stealth dicing (SD) layer 214 within the semiconductor wafer. The back-side surface of the semiconductor wafer is located opposite to a front-side surface 208 of the semiconductor wafer on which a circuitry layer 206 is formed. Alternatively, the laser stealth dicing is performed from the front-side surface of the semiconductor wafer. In the embodiment depicted in FIG. 2, the stealth dicing layer 214 defines a laser modification zone 216. For example, the laser modification zone 216 is a dimensional area within the wafer that consists primarily of modified silicon substrate, e.g., polycrystalline silicon.

The stealth dicing layer 214 is created as the original substrate material absorbs the energy of a laser beam. Compared to the original substrate material, the stealth dicing layer has a larger volume. For example, the volume of the newly formed polycrystalline silicon is larger than the volume of monocrystalline silicon. Because of the larger volume of the stealth dicing layer, a crack is generated around the stealth dicing layer and is propagated to back-side and front-side surfaces of the semiconductor wafer. For a silicon wafer with monocrystalline silicon substrate material, the stealth dicing layer is a polycrystalline silicon structure. Because a laser beam is concentrated at focus points within the semiconductor wafer, the dimension (i.e., the width and the thickness) of the stealth dicing layer is relatively small. The dimension of the stealth dicing layer varies for different lasers and configurations. The stealth laser operation at a particular focus point within the wafer is also referred to as a stealth laser scan. Multiple stealth laser scans can be applied to a wafer at different focus points. For example, stealth laser scans can be applied to a wafer at focus points at different wafer depths, measured, for example, from the back-side surface 202 or the front-side surface 208 of the semiconductor wafer.

In the embodiment depicted in FIG. 2, the stealth laser dicing system 220 includes at least one focusing lens 222 configured to condense a laser beam and to focus the laser beam at a light focus point or a focal point 212 that is inside substrate layer 204 of the semiconductor wafer. In an embodiment, the laser beam that goes through the focusing lens is formed by short pulses with a high oscillation frequency. The condensed and focused laser beam has a high peak power density and is timely and spatially compressed in the vicinity of the light focus point. When the power density of the laser beam exceeds a peak power density threshold, a nonlinear absorption effect causes a phenomenon in which extremely high absorption occurs at localized points. The focusing lens can be adjusted to cause the nonlinear absorption effect in the vicinity of the light focus point inside the semiconductor wafer. Consequently, only localized points in the semiconductor wafer are laser processed without damaging the surrounding substrate material of the semiconductor wafer and the circuitry on the front side surface 208 of the semiconductor wafer. Because the effects of stealth laser dicing occur only at the light focus point, the front and back side surfaces 208, 202 of the semiconductor wafer are not damaged by stealth laser dicing. The stealth laser dicing system 220 may include other supporting elements, e.g., such as a laser source, alignment equipment such as an infrared camera, and mechanical components such as a housing structure and a conveyor belt.

In an embodiment, a movable stage or a conveyor belt (not shown) is used to hold the semiconductor wafer when stealth laser dicing is performed. In this embodiment, the stage or the conveyor belt moves the semiconductor wafer for the stealth laser scan of the semiconductor wafer according to a desired dicing pattern. In an embodiment, the stealth dicing layer 214 is formed by a laser beam as the wafer moves. Alternatively, the wafer may be fixed in a particular location and a laser beam move in a certain direction to perform the laser operation.

Conventional laser dicing technology uses the physical phenomena such as laser heat melt cutting, ablation and thermal stress cutting that melt the surface of a semiconductor wafer. Laser beams used in conventional laser dicing technology are absorbed from the surface of the semiconductor wafer to melt the semiconductor material beginning from the wafer surface. Because conventional laser dicing technology relies on thermal processing beginning from the wafer surface, heat and debris are unavoidably produced during laser machining, causing adverse effects on device characteristics and reliability. For example, micro cracks can occur on edges of separated dies during conventional laser dicing, which negatively affect reliability of packaged devices. In addition, because conventional laser dicing technology typically performs thermal processing at the wafer surface in which the circuitry is located, wafer surface layers in which actual devices are formed can be damaged during the laser operation.

Compared to conventional laser dicing technology, stealth dicing makes use of a laser beam that transmits through a wafer, e.g., a monocrystalline silicon semiconductor wafer. Instead of melting the wafer from its surface, in stealth dicing, a laser beam is guided to the vicinity of a focal point inside the wafer to perform a selective, localized laser machining. In addition, because stealth dicing is perform from the back-side of the semiconductor wafer, which is opposite from the circuitry layer, or from the front-side of the semiconductor wafer at the space between actual circuits, stealth dicing avoids damaging wafer surface sections where the actual circuits are formed. Compared to conventional laser dicing technology, stealth dicing eliminates problems common to conventional laser dicing technology, such as, thermal effects on the active area, debris contamination, and drop in breakage resistance dues to die edge cracks Conventional blade dicing technology uses a blade to mechanically cut a semiconductor wafer into separate IC dies from the top side where the circuitry layer is located. In blade dicing, pressure is applied on the wafer surface to allow a blade to cut into the wafer surface. Because pressure is applied on the wafer surface, cracks often occur at edges of separated dies, especially the backside edges, which reduces reliability of packaged devices or bare dies used in flip chip assembly, e.g., for RFID chips. In addition, because of mechanical constraints, the thickness of a dicing blade is on the order of tens of micrometers (μm), which causes a sawlane width of over 50 μm. For example, typical sawlane width in blade dicing can be in the range of between 60 and 80 μm.

Compared to blade dicing, stealth laser dicing makes use of a laser beam to perform a selective, localized laser machining. Because pressure is not applied on the wafer surface in stealth laser dicing, cracks that often occur at edges of separated dies are avoided. In addition, because the wafer does not need to be mechanically separated using a blade, the sawlane width of stealth laser dicing can be kept low, which makes stealth laser dicing suitable for ultrathin wafer processing. For example, the sawlane width in stealth laser dicing can be reduced to around 15 μm, compared to the 60 to 80 μm sawlane width in blade dicing. With the reduced sawlane width, the amount of potential good dies per wafer (PGDW) can be significantly increased.

Figure 3A:
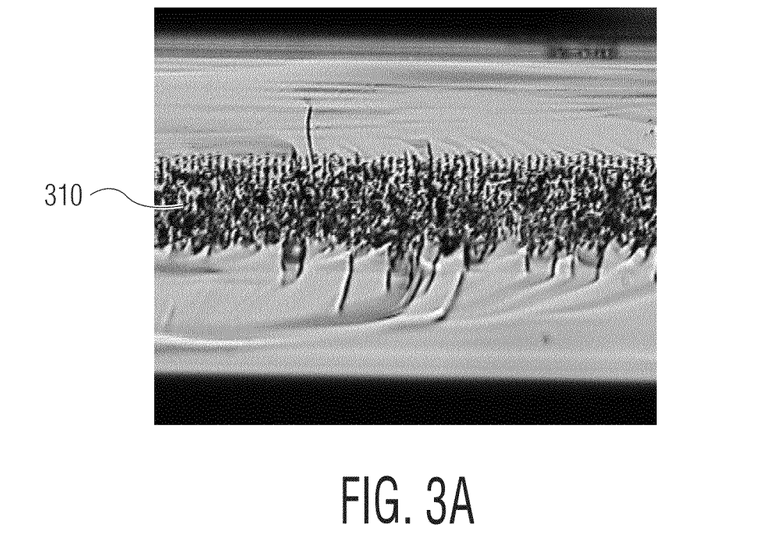
FIGS. 3a and 3b depict cross-section views of examples of laser modification zones of a semiconductor wafer.
Figure 3B:
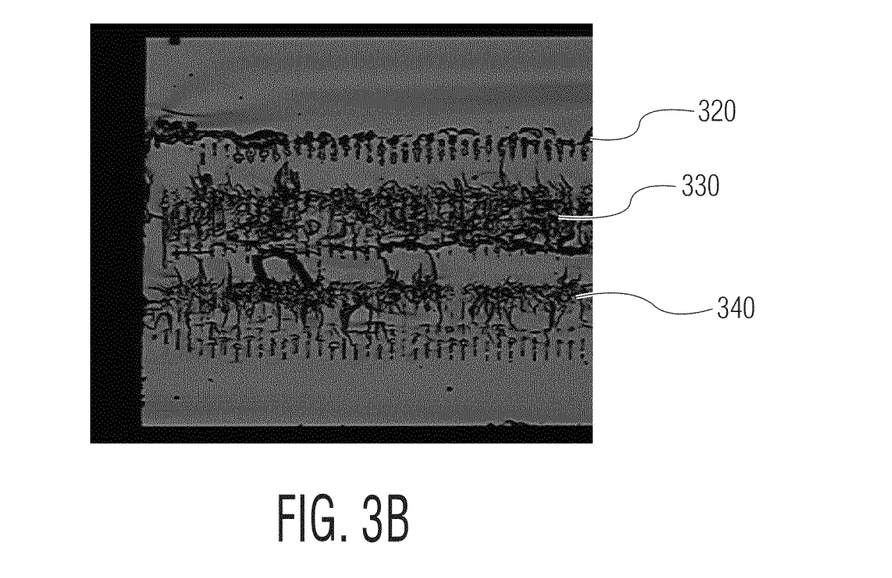

During a stealth laser scan, a stealth dicing layer is created in the silicon layer of the wafer, which leads to a crack that later can be used to separate the dies from each other with an expansion process. FIGS. 3a and 3b shows examples of modification zones 310, 320, 330 in cross-section views of a semiconductor wafer. Specifically, FIG. 3a shows a modification zone 310 after one stealth laser scan and FIG. 3b shows modification zones 320, 330, 340 after two stealth laser scans. The height of the modification zone 310 in FIG. 3a is between 40 μm and 50 μm and the depth of the modification zone 310 is between 5 μm and 8 μm.

The laser modification zone created by the stealth laser scan can weaken die sidewalls of the semiconductor device and can lead to die cracking during wafer processing and/or usage. For example, when wafer processing forces a high stress on the dies, especially at their edges, cracked die edges can appear in devices that are assembled at customer sites. In addition, because the die thickness is further reduced after stealth laser processing, cracks can more easily form in dies.

The strength of the separated dies can affect the quality of the packaged chips or bare dies used in flip chip assembly, e.g., for RFID chips. For example, the high die strength is a major criterion for all banking and passport card products due to high warpage when the cards are used or carried around, e.g., in the back pocket of the pants. For radio frequency identification (RFID) tags, the higher die strength reduces the possibility of die crack during a flip chip assembly process. When the die strength is increased, the strength of packaged chips can be increased and field returns of the final products can be reduced. Thinner IC packages that are newly manufactured must be as robust as existing thick packages.

Turning back to FIG. 1, in the blade cleaning step 108, at least a portion of the stealth dicing layer formed by stealth laser dicing is removed using a blade. Removing at least a portion of the stealth dicing layer strengthens the sidewalls of each individual die, stabilizes the die structure, and reduces the occurrence of cracking during subsequent assembly steps. The purpose of the blade cleaning step 108 is to clean the stealth dicing layer, not to separate the wafer into individual IC dies. In the blade cleaning step 108, the blade does not cut all the way through the semiconductor wafer. In an embodiment, the blade cuts the semiconductor wafer at the same depth within the stealth dicing layer as laser stealth dicing without separating the semiconductor wafer and penetrating/damaging the front-side surface on which the circuitry is located. Compared to conventional blade dicing technology, the blade cleaning step 108 can reduce or even eliminate cracking on the circuitry layer of individual IC dies.

In an embodiment, the stealth laser dicing step 106 and the blade cleaning step 108 are done from a back-side surface of a semiconductor wafer that is opposite from a front side surface of the semiconductor wafer on which the circuitry is located. In another embodiment, the stealth laser dicing step is done from the front-side surface of a semiconductor wafer while the blade cleaning step is done from the back-side surface of the semiconductor wafer. Some examples of back-side stealth laser dicing and blade cleaning are described with reference to FIGS. 4 and 5.

Figure 4:
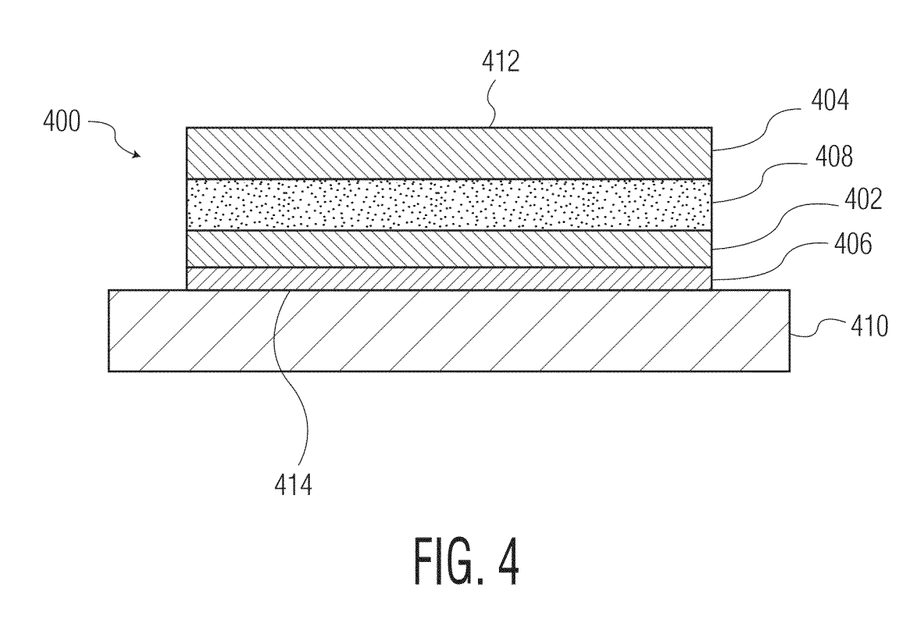
FIG. 4 depicts a cross-section view of a semiconductor wafer after a stealth laser dicing step.

During stealth laser dicing, the wafer can be mounted top side down on dicing tape. FIG. 4 depicts a cross-section view of a semiconductor wafer 400 after the stealth laser dicing step 106. In the embodiment depicted in FIG. 4, which is oriented top side down, a dicing tape 410 is affixed to a top metal layer 406 in which the circuitry is located at a front-side surface 414 of the wafer 400. A body substrate layer 402, e.g., a wafer silicon layer, is located on top of the top metal layer, with respect to the orientation of FIG. 4. A modification zone 408 is located on top of the wafer substrate layer, with respect to the orientation of FIG. 4. A surface substrate layer 404, e.g., a wafer silicon layer, at a back-side surface 412 of the wafer 400 is located on top of the modification zone, with respect to the orientation of FIG. 4.

Figure 5:
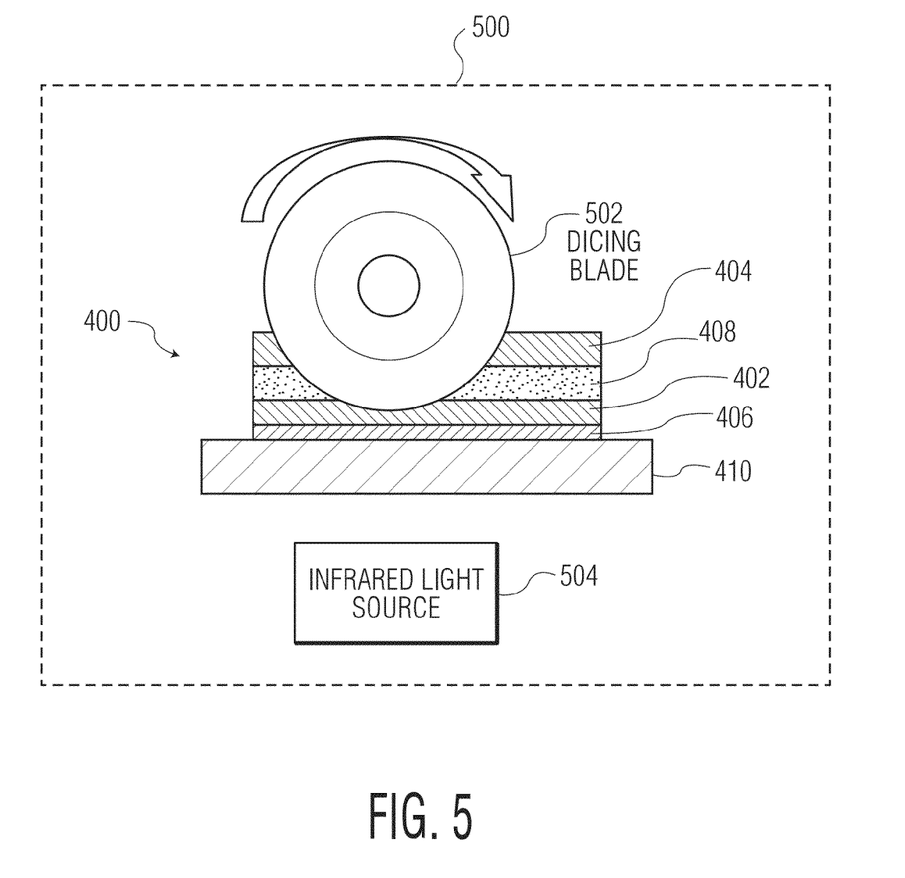
FIG. 5 shows a blade clean system in accordance with an embodiment of the invention.

The blade cut is also done from the backside of the wafer 400, i.e., the major surface that is away from the circuitry located in the top metal layer 406. FIG. 5 depicts a blade clean system 500 that can be used to perform the blade cleaning step 108 in accordance with an embodiment of the invention. In the embodiment depicted in FIG. 5, the blade clean system 500 includes a blade 502 and an optional infrared (IR) light source 504, such as an IR camera. The blade removes the modification zone 408 of the semiconductor wafer of FIG. 4, as described above. In the embodiment depicted in FIG. 5, the blade cuts through the exposed substrate layer 404 and cuts within the modification zone to clean the stealth dicing layer. The blade clean system 500 may include other supporting elements, such as, a controller for the blade and mechanical features such as a housing structure for the blade cleans system 500. Because the laser beam is concentrated at focus points within the semiconductor wafer 400, the width of the stealth dicing layer is relatively small. The thickness or the width of the blade is chosen to accommodate the width of the stealth dicing layer. Because the width of the blade matches the width of the stealth dicing layer, at least a portion of the stealth dicing layer is removed by the blade. In some embodiments, the width of the blade is much larger than the width of the stealth dicing layer. In these embodiments, the entire stealth dicing layer is removed using the blade.

Figure 6A:
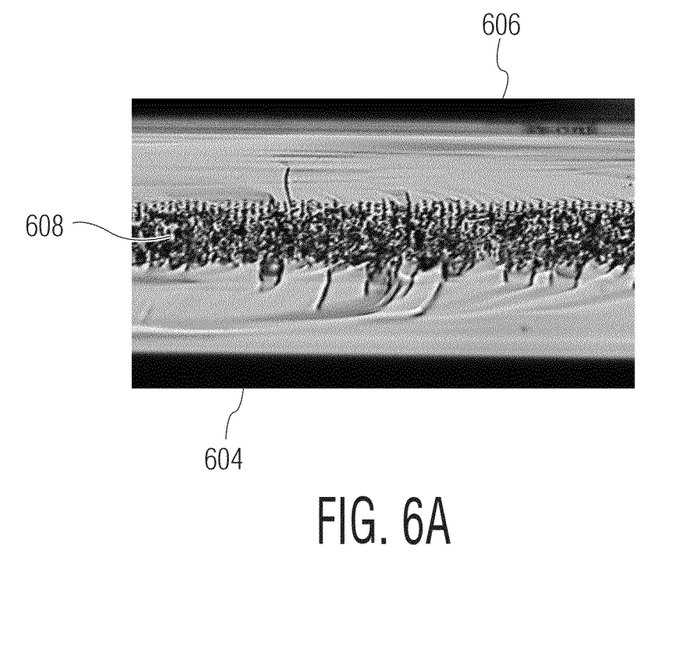
FIGS. 6a and 6B depict examples of a semiconductor wafer before blade cleaning and after blade cleaning.
Figure 6B:
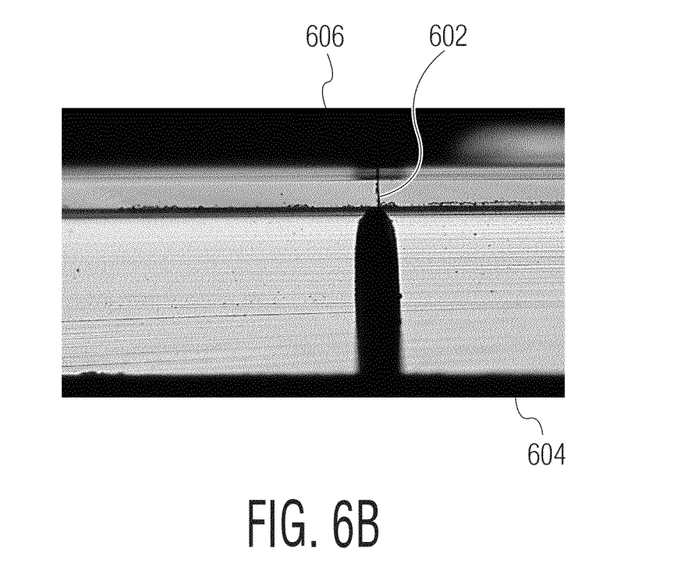

Examples of a semiconductor wafer 600 having a back-side surface 604 and a front-side surface 606 before the blade cleaning step 108 and after the blade cleaning step 108 are shown in FIGS. 6a and 6b, which are both cross-section views of the wafer. The semiconductor wafer 600 has a back-side surface 604 on which the substrate material is located and a front-side surface 606 on which a circuitry layer is located. The view shown in FIG. 6b is shifted 90 degree from the viewed shown in FIG. 6a. Specifically, the view shown in FIG. 6a is a sectional view of the wafer that is cut along the direction of the stealth laser scan while the view shown in FIG. 6b is a sectional view of the wafer that is cut in perpendicular to the direction of the stealth laser scan.

FIG. 6a shows a cross-section view of the semiconductor wafer 600 before the blade cleaning. As depicted in FIG. 6a, a laser modification zone 608 is visibly present in the semiconductor wafer. FIG. 6b shows a cross-section view of the semiconductor wafer in line with the plane of the modification zone after the blade cleaning. The blade cleaning is used to remove the stealth dicing layer but does not separate the IC dies. In blade cleaning, the blade does not cut all the way through the semiconductor wafer. The blade cuts the semiconductor wafer at a depth within the semiconductor wafer that will remove the stealth dicing layer without separating the semiconductor wafer and penetrating the front-side surface 606 of the wafer on which the circuitry is located. After the blade cleaning, the laser modification zone 608 on side walls of two adjacent dies has been removed from the back-side and is no longer visible. As depicted in FIG. 6b, the crack 602 caused by stealth laser dicing is visible. The crack 602 caused by stealth laser dicing is present in the semiconductor wafer after stealth laser dicing. However, because the view shown in FIG. 6a is a sectional view of the wafer that is cut along the direction of the stealth laser, the crack 602 is not visible in FIG. 6a.

Figure 7:
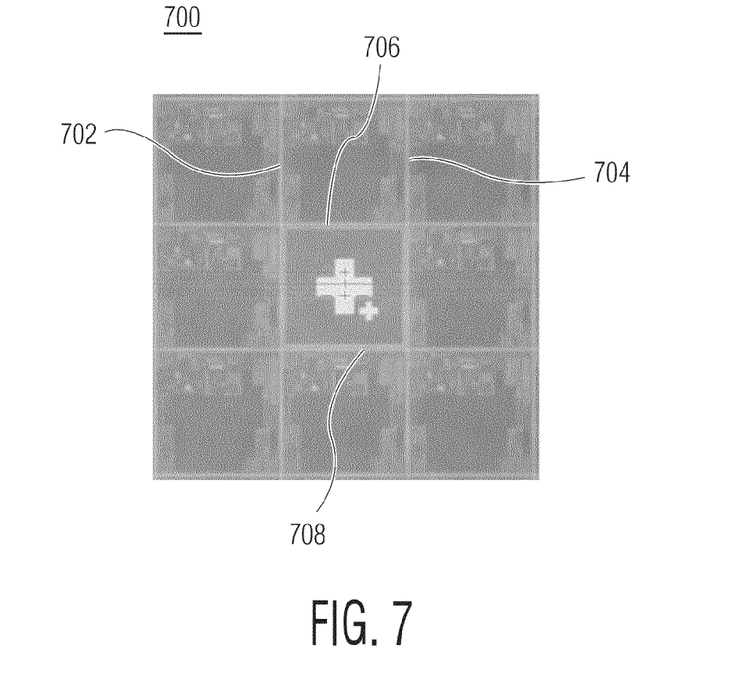
FIG. 7 depicts a view highlighted by an infrared light source from a back-side of a semiconductor wafer.

Alignment of the blade cleaning step 108 can be done with the infrared light source 504. FIG. 7 depicts a view 700 of a 3×3 grid of dies on a wafer that is highlighted by an infrared light source from the back-side of the semiconductor wafer. A blade can be used to cut into the backside of the wafer along the lines 702, 704, 706, 708 highlighted by the infrared light source.

Figure 8:
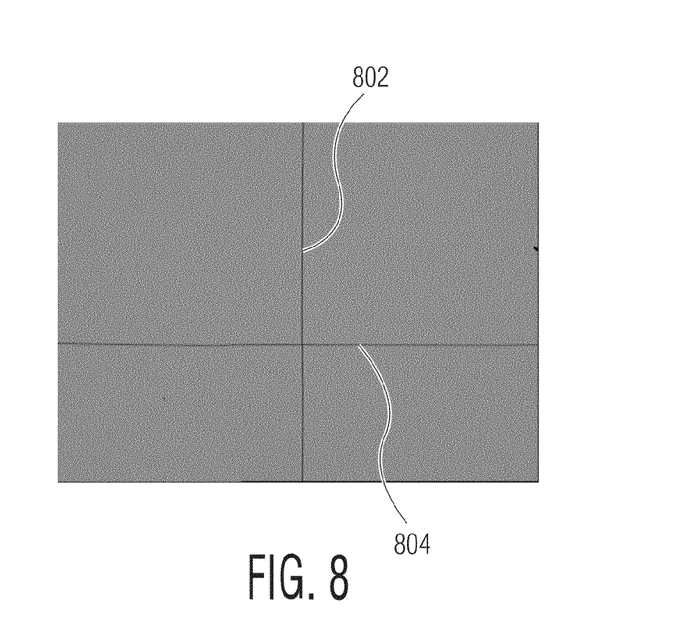
FIG. 8 depicts two cracks that are already visible after stealth laser dicing.

Alternatively, alignment of the blade cleaning step 108 can be done using the cracks that are formed from the stealth laser dicing. FIG. 8 depicts two cracks 802, 804 that are visible from the backside of the semiconductor wafer after stealth laser dicing. A blade can be used to cut into the backside of the wafer along the visible cracks 802, 804. Occasionally, an IR light source can be used to enhance the alignment of the blade cleaning.

Turning back to FIG. 1, after the blade cleaning step 108 is performed, IC dies can be separated, using, for example, an expansion technique. In contrast to conventional blade dicing technology where the IC dies are completely separated as a result of blade dicing, the individual IC dies are still integrated with the wafer after the stealth laser dicing step 106 and the blade cleaning step 108 because in the blade cleaning step 108, the blade does not cut all the way through the semiconductor wafer to separate the semiconductor wafer into two unconnected pieces.

Figure 9A:
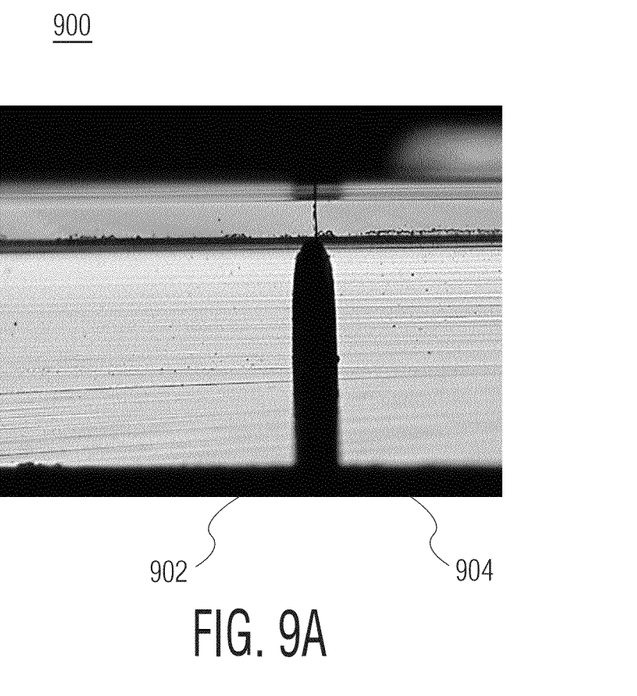
FIGS. 9a and 9b show cross-section views of a semiconductor wafer before tape expansion and after tape expansion.
Figure 9B:
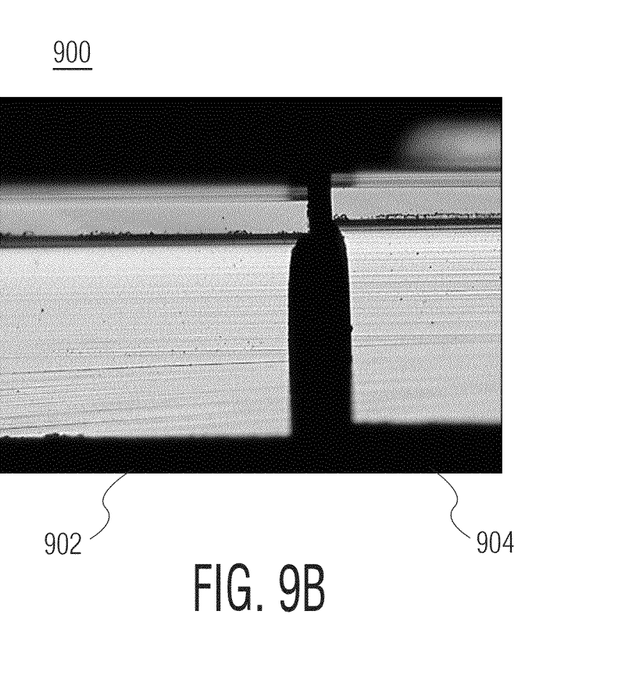

In the tape expand step 110, the stealth-diced and blade-cleaned IC dies are separated by utilizing a force generated during tape expansion that acts to expand the space between the chips. FIGS. 9a and 9b show cross-section views of a semiconductor wafer 900 before tape expansion and after tape expansion. As shown in FIG. 9a, two adjacent IC dies 902, 904 are still not separated after the stealth laser dicing and the blade cleaning. As shown in FIG. 9b, these two adjacent IC dies 902, 904 are finally separated after the tape expansion. The wafer can be separated into the desired shape conforming to a SD layer pattern formed within the wafer.

After dies are separated, the die bonding step 112 is performed to attach each semiconductor die to its package or to a substrate such as tape carrier for tape automated bonding. In an embodiment, each die is first picked from a separated wafer tray and then permanently attached to the carrier or substrate.

Figure 10:
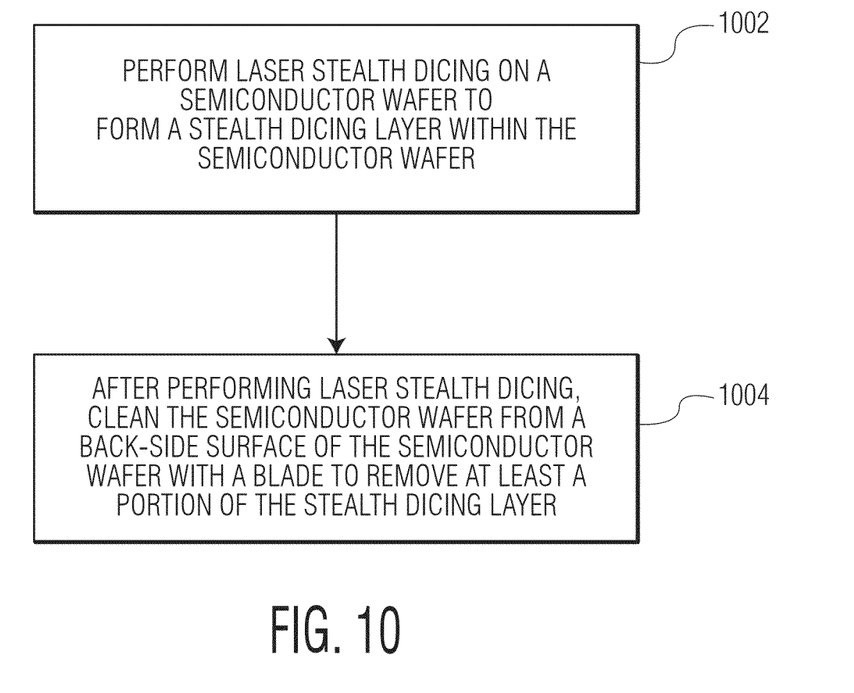
FIG. 10 is a process flow diagram of a method for processing a semiconductor wafer in accordance with an embodiment of the invention.

FIG. 10 is a process flow diagram of a method for processing a semiconductor wafer in accordance with an embodiment of the invention. At block 1002, laser stealth dicing is performed on a semiconductor wafer to form a stealth dicing layer within the semiconductor wafer. At block 1004, after performing laser stealth dicing, the semiconductor wafer is cleaned from a back-side surface of the semiconductor wafer with a blade to remove at least a portion of the stealth dicing layer.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for processing a semiconductor wafer comprising:
    performing laser stealth dicing on a semiconductor wafer to form a stealth dicing layer within the semiconductor wafer, comprising applying a laser beam through a substrate material of the semiconductor wafer at a focus point that is within the semiconductor wafer to change the substrate material around the focus point and propagate a crack in the semiconductor wafer;
    thinning the semiconductor wafer to a predefined thickness before performing laser stealth dicing;
    after performing laser stealth dicing, cleaning the semiconductor wafer from a back-side surface of the semiconductor wafer with a blade to remove at least a portion of the stealth dicing layer, comprising cutting through the back-side surface of the semiconductor wafer along the crack without cutting entirely through and separating the semiconductor wafer; and
    separating the semiconductor wafer into individual dies using tape expansion after cleaning the semiconductor wafer.

2. The method of claim 1, wherein performing laser stealth dicing on the semiconductor wafer comprises performing laser stealth dicing on the semiconductor wafer from the back-side surface of the semiconductor wafer, wherein the back-side surface of the semiconductor wafer is located opposite to a front-side surface of the semiconductor wafer, and wherein a circuitry layer is formed on the front-side surface of the semiconductor wafer.

3. The method of claim 1, wherein cutting through the back-side surface of the semiconductor wafer includes cutting through the back-side surface of the semiconductor wafer at the same depth within the semiconductor wafer as the stealth dicing layer.

4. The method of claim 1, wherein cutting through the back-side surface of the semiconductor wafer includes cutting through the back-side surface of the semiconductor wafer according to a pattern that is highlighted by an infrared light source.

5. The method of claim 1, wherein performing laser stealth dicing comprises applying the laser beam through a silicon substrate of the semiconductor wafer at the focus point that is within the silicon substrate to change a monocrystalline silicon structure around the focus point into a polycrystalline silicon structure and to propagate the crack in the semiconductor wafer.

6. The method of claim 1, further comprising applying a dicing tape onto a front-side surface of the semiconductor wafer, wherein a circuitry layer is formed on the front-side surface of the semiconductor wafer.

7. The method of claim 1, further comprising packaging the individual dies into radio frequency identification (RFID) tags.

8. A method for processing a semiconductor wafer comprising:
    performing laser stealth dicing on a semiconductor wafer to form a stealth dicing layer within the semiconductor wafer, wherein performing laser stealth dicing comprises applying a laser beam through a silicon substrate of the semiconductor wafer at a focus point that is within the silicon substrate to change a monocrystalline silicon structure around the focus point into a polycrystalline silicon structure and to propagate a crack in the semiconductor wafer;
    thinning the semiconductor wafer to a predefined thickness before performing laser stealth dicing;
    after performing laser stealth dicing, cleaning the semiconductor wafer from a back-side surface of the semiconductor wafer with a blade to remove at least a portion of the stealth dicing layer, wherein cleaning the semiconductor wafer includes cutting through the back-side surface of the semiconductor wafer at the stealth dicing layer using the blade without cutting entirely through the semiconductor wafer; and
    separating the semiconductor wafer into individual dies using tape expansion after cleaning the semiconductor wafer.

9. The method of claim 8, wherein performing laser stealth dicing on the semiconductor wafer comprises performing laser stealth dicing on the semiconductor wafer from the back-side surface of the semiconductor wafer, wherein the back-side surface of the semiconductor wafer is located opposite to a front-side surface of the semiconductor wafer, wherein a circuitry layer is formed on the front-side surface of the semiconductor wafer, and wherein cutting through the back-side surface of the semiconductor wafer includes cutting through the back-side surface of the semiconductor wafer without penetrating the front-side surface of the semiconductor wafer.

* * * * *